United States Patent
Liao et al.

(10) Patent No.: US 10,756,573 B2
(45) Date of Patent: Aug. 25, 2020

(54) DEVICE FOR HARVESTING AND MANAGING WIRELESS ENERGY

(71) Applicant: NATIONAL CHIAO TUNG UNIVERSITY, Hsinchu (TW)

(72) Inventors: Yu-Te Liao, Hsinchu (TW); Shu-Hsuan Lin, Kaohsiung (TW); Wei-Chih Shih, Tainan (TW); Chen-Yi Kuo, Taipei (TW)

(73) Assignee: National Chiao Tung University, Hsinchu (TW)

(*) Notice: Subject to any disclaimer, the term of this patent is extended or adjusted under 35 U.S.C. 154(b) by 357 days.

(21) Appl. No.: 15/699,120

(22) Filed: Sep. 8, 2017

(65) Prior Publication Data
US 2018/0366981 A1 Dec. 20, 2018

(30) Foreign Application Priority Data
Jun. 20, 2017 (TW) .............................. 106120549 A

(51) Int. Cl.
*H02J 50/05* (2016.01)
*H02M 7/53846* (2007.01)
(Continued)

(52) U.S. Cl.
CPC .............. *H02J 50/05* (2016.02); *H02J 50/20* (2016.02); *H02M 7/53846* (2013.01); *H03H 7/40* (2013.01)

(58) Field of Classification Search
CPC .............. H05B 33/0815; H05B 33/083; H05B 33/0851; H05B 33/0854
(Continued)

(56) References Cited

U.S. PATENT DOCUMENTS

| 4,323,960 A | * | 4/1982 | Jones | ...................... H02M 1/10 363/48 |
| 6,055,169 A | * | 4/2000 | Bowman | ................. H02J 1/102 363/65 |

(Continued)

OTHER PUBLICATIONS

Yan Lu, et al.; "A Wide Input Range Dual-Path CMOS Rectifier for RF Energy Harvesting"; IEEE Trans. Circuits Syst. II: Express Briefs, vol. 64, No. 2, pp. 166-170, Feb. 2017 (initial publication Apr. 2016).

(Continued)

*Primary Examiner* — Daniel Kessie
*Assistant Examiner* — Brian K Baxter
(74) *Attorney, Agent, or Firm* — Rosenberg, Klein & Lee

(57) ABSTRACT

A device for harvesting and managing wireless energy includes a wireless receiver, a first rectifier, a first capacitor, a voltage detection circuit, a first electrical switch, a second rectifier and a second capacitor connected to each other. The wireless receiver receives a wireless RF signal and converts it into an AC voltage with an input power. The first rectifier receives the AC voltage, converts it into a first DC voltage and transmits the first DC voltage to a load. The voltage detection circuit has a threshold voltage value and detects the first DC voltage. When the first DC voltage is larger than the threshold voltage value, the voltage detection circuit turns on the first electrical switch and the second rectifier receives the AC voltage through the first electrical switch to share the input power received by the first rectifier, thereby achieving the high energy conversion efficiency.

10 Claims, 12 Drawing Sheets

(51) Int. Cl.
*H02J 50/20* (2016.01)
*H03H 7/40* (2006.01)

(58) Field of Classification Search
USPC .......................................................... 307/19
See application file for complete search history.

(56) References Cited

U.S. PATENT DOCUMENTS

| | | | |
|---|---|---|---|
| 7,084,605 B2 | 8/2006 | Mickle et al. | |
| 10,418,841 B2* | 9/2019 | Danilovic | H04B 5/0037 |
| 2007/0273463 A1* | 11/2007 | Yazdi | G01D 21/00 |
| | | | 335/78 |
| 2008/0129610 A1 | 6/2008 | Tsfati et al. | |
| 2008/0150475 A1* | 6/2008 | Kato | H02J 7/022 |
| | | | 320/107 |
| 2010/0277140 A1* | 11/2010 | Liu | H02J 1/10 |
| | | | 323/234 |
| 2011/0018354 A1* | 1/2011 | Liu | H02J 4/00 |
| | | | 307/82 |
| 2011/0069516 A1* | 3/2011 | Greene | H02J 1/10 |
| | | | 363/126 |
| 2013/0026982 A1* | 1/2013 | Rothenbaum | H02J 17/00 |
| | | | 320/108 |
| 2013/0128638 A1* | 5/2013 | Irish | H02M 1/4266 |
| | | | 363/126 |
| 2014/0153294 A1* | 6/2014 | Deboy | H02M 3/33569 |
| | | | 363/21.04 |
| 2014/0327390 A1* | 11/2014 | Park | H02J 50/12 |
| | | | 320/108 |
| 2015/0137611 A1* | 5/2015 | Huang | H02J 50/12 |
| | | | 307/104 |
| 2015/0263511 A1* | 9/2015 | Sandner | H02H 7/1252 |
| | | | 363/53 |
| 2015/0295403 A1* | 10/2015 | Lewis, III | H02J 4/00 |
| | | | 307/26 |
| 2016/0043658 A1* | 2/2016 | Lopez | H02M 7/217 |
| | | | 363/89 |
| 2016/0204658 A1* | 7/2016 | Bae | H02J 7/025 |
| | | | 307/104 |
| 2016/0294221 A1* | 10/2016 | Maniktala | H02J 50/12 |
| 2017/0070160 A1* | 3/2017 | Mortazawi | H02M 7/06 |
| 2018/0013313 A1* | 1/2018 | Lee | H02J 50/40 |
| 2018/0062419 A1* | 3/2018 | Park | H02J 50/10 |
| 2018/0062421 A1* | 3/2018 | Danilovic | H02J 50/10 |
| 2018/0131231 A1* | 5/2018 | Nakano | H02J 7/00 |
| 2018/0166915 A1* | 6/2018 | Afridi | H02J 50/05 |
| 2018/0314318 A1* | 11/2018 | Remis | G06F 1/26 |
| 2019/0165614 A1* | 5/2019 | Afridi | H02J 7/025 |

OTHER PUBLICATIONS

Xiwen Zhang & Hoi Lee; "An Efficiency-Enhanced Auto-Reconfigurable 2x/3x Charge Pump for Transcutaneous Power Transmission"; IEEE J. Solid-State Circuits, vol. 45, No. 9, pp. 1906-1922, Sep. 2010.

Ping-Hsuan Hsieh, Chin-Hsien Chou & Tao Chiang, "An RF Energy Harvester with 44.1% PCE at Input Available Power of -12 dBm"; IEEE Trans. Circuits Syst. I, Reg. Papers, vol. 62, No. 6, pp. 1528-1537, Jun. 2015.

Mohamed A. Abouzied, Krishnan Ravichandran & Edgar Sanchez-Sinencio, "A Fully Integrated Self-Startup RF Energy-Harvesting System with Storage Capability"; IEEE J. Solid-State Circuits, vol. 52, No. 3, pp. 704-719, Mar. 2017.

Shu-Hsuan Lin, et al., "A High-Efficiency Power Management IC with Power-Aware Multi-path Rectifier for Wide-Range RF Energy Harvesting"; IEEE Radio Frequency Integrated Circuits Symposium, Jun. 6, 2017, Hawai'i Convention Center.

* cited by examiner

DEVICE FOR HARVESTING AND MANAGING WIRELESS ENERGY

This application claims priority for Taiwan patent application no. 106120549 filed on Jun. 20, 2017, the content of which is incorporated by reference in its entirety.

BACKGROUND OF THE INVENTION

Field of the Invention

The present invention relates to a device for harvesting and managing energy, particularly to a device for harvesting and managing wireless energy.

Description of the Related Art

The radio-frequency (RF) energy-harvesting technology is massively applied to the biomedical system, the RF identification (RFID) system, the vehicle recognition system and the factory/market automation system and will be the important technology for the Internet of things (IoT) in the future. Presently, admitted by the US food and health bureau, the RF energy-harvesting technology is the only approved charging technology applied to the biomedical system to extend the life of batteries and even design a battery-free biomedical sensing system. However, easily affected by environments, the RF energy management circuit merely achieves the high efficiency within a narrow input power range. As a result, even within the fixed range, most of the energy-harvesting systems have to commonly face a problem that the strength of RF energy is not easily controlled. Besides, in a general RFID sensing system, the sensitivity for harvesting wireless energy usually limits distances and ranges for driving communicators and sensors. The sensitivity represents the minimum energy intensity required when wireless energy is harvested.

The conventional device for harvesting and managing wireless energy is shown in FIG. 1. The device includes an antenna 10, a matching circuit 12, a rectifier 14, a DC to DC converter 16 and a low dropout (LDO) linear regulator 18. The matching circuit 12 has fixed impedance. The DC to DC converter 16 has a fixed conversion ratio. The rectifier 14 receives a RF signal through the antenna 10 and the matching circuit 12 and converts the RF signal into a first DC voltage. The DC to DC converter 16 converts the first DC voltage into a second DC voltage and transfers the second DC voltage to a load 20. Since the RF signal varies, input impedance of the rectifier 14 also varies. In such a case, the fixed impedance of the matching circuit 12 cannot match the input impedance of the rectifier 14. The output signal of the matching circuit 12 is reflected by the rectifier 14. In addition, when the first DC voltage is too high, the second DC voltage is greatly higher than the voltage required by the load 20. Since an output voltage of the LDO linear regulator 18 is greatly higher than a rated voltage of the load 20 and the output voltage of the LDO linear regulator 18 cannot change when the RF signal changes, the LDO linear regulator 18 will spend most of energy to reduce the energy conversion efficiency of the device for harvesting and managing wireless energy. The relationship between the input power of the RF signal and the energy conversion efficiency is shown in FIG. 2. When the input power is too low, the output power of the device for harvesting and managing wireless energy is limited by conduction voltages of transistors. When the input power is too high, the output power of the device for harvesting and managing wireless energy is limited by inverse currents and leakage currents of transistors. Thus, when the input power is too low or too high, the energy conversion efficiency is decreased. In other words, when the antenna 10 receives a low-level RF signal, the energy conversion efficiency is decreased. When the input power of the RF signal is too high, most of energy wastes up.

To overcome the abovementioned problems, the present invention provides a device for harvesting and managing wireless energy, so as to solve the afore-mentioned problems of the prior art.

SUMMARY OF THE INVENTION

A primary objective of the present invention is to provide a device for harvesting and managing wireless energy, which provides at least one new path to share the input power originally received by a main path when the input power is increased and the energy conversion efficiency generated by the main path is decreased. Thus, the energy conversion efficiency corresponding to the main path is increased to extend the range of the input power that can achieve the high energy conversion efficiency.

Another objective of the present invention is to provide a device for harvesting and managing wireless energy, which provide a new path to store electric energy when the input power is increased. When the input power is insufficiently provided to a load, the stored electric energy is provided to the load to sustain the operation and overcome the issues of sudden energy loss due to environment changes.

Further objective of the present invention is to provide a device for harvesting and managing wireless energy, which uses a reconfigurable DC to DC converter to switch a conversion ratio of a DC voltage according to different values of a first DC voltage, thereby improving the overall energy conversion efficiency.

Yet another objective of the present invention is to provide a device for harvesting and managing wireless energy, which adjusts a capacitive impedance value of a variable capacitance circuit in response to the variation of a radio-frequency (RF) signal, so as to match the input impedance of a first rectifier and improve overall energy conversion efficiency.

To achieve the abovementioned objectives, the present invention provides a device for harvesting and managing wireless energy, which comprises a wireless receiver, a first rectifier, a first capacitor, a voltage detection circuit, a first electrical switch, a second rectifier, and a second capacitor. The wireless receiver receives a wireless radio-frequency (RF) signal and converts the wireless RF signal into an alternating-current (AC) voltage with input power. The first rectifier is connected with the wireless receiver, receives the AC voltage and converts the AC voltage into a first direct-current (DC) voltage. The first capacitor is connected with the first rectifier and a load, receives the first DC voltage and provides the first DC voltage for the load. The voltage detection circuit has a first voltage value, and the voltage detection circuit is connected with the first capacitor and detects the first DC voltage. The first electrical switch is connected with the wireless receiver and the voltage detection circuit, and the first electrical switch is turned off, and when the first DC voltage is larger than the first voltage value, the voltage detection circuit turns on the first electrical switch. The second rectifier is connected with the wireless receiver through the first electrical switch, and when the first DC voltage is larger than the first voltage value, the second rectifier receives the AC voltage through the first electrical switch, and converts the AC voltage into a second DC voltage to share the input power received by the first rectifier. The second capacitor is connected with the second rectifier and the second DC voltage charges the second capacitor.

In an embodiment of the present invention, the device for harvesting and managing wireless energy further comprises a second electrical switch and a third rectifier. The second electrical switch is connected with the wireless receiver and the voltage detection circuit, and the second electrical switch is turned off, and the voltage detection circuit has a second voltage value, and the first voltage value is less than the second voltage value, and when the first DC voltage is larger than the second voltage value, the voltage detection circuit turns on the second electrical switch. The third rectifier is connected with the wireless receiver through the second electrical switch and connected with the second capacitor, and when the first DC voltage is larger than the second voltage value, the third rectifier receives the AC voltage through the second electrical switch and converts the AC voltage into a third DC voltage to share the input power received by the first rectifier and the second rectifier, and the third DC voltage charges the second capacitor.

In an embodiment of the present invention, the device for harvesting and managing wireless energy further comprises a third electrical switch and a fourth electrical switch. The third electrical switch is connected between the second capacitor and the second rectifier, and connected with the voltage detection circuit. The third electrical switch is turned off, and when the first DC voltage larger than the first voltage value, the voltage detection circuit turns on the third electrical switch, and the second DC voltage charges the second capacitor through the third electrical switch. The fourth electrical switch is connected between the second capacitor and the third rectifier and connected with the voltage detection circuit. The fourth electrical switch is turned off, and when the first DC voltage larger than the second voltage value, the voltage detection circuit turns on the fourth electrical switch, and the third DC voltage charges the second capacitor through the fourth electrical switch.

In an embodiment of the present invention, the device for harvesting and managing wireless energy further comprises an operation switch connected between the load and the first capacitor, and connected with the voltage detection circuit, and the voltage detection circuit has an operation voltage value, and the first voltage value is larger than the operation voltage value, and when the first DC voltage is larger than the operation voltage value, the voltage detection circuit turns on the operation switch, the first capacitor provides the first DC voltage for the load through the operation switch.

In an embodiment of the present invention, the voltage detection circuit further comprises a fifth electrical switch turned off, a first voltage detector, a second voltage detector and a third voltage detector. The first voltage detector has the operation voltage value, and the first voltage detector is connected with the operation switch and the first capacitor, and the first voltage detector detects the first DC voltage, and when the first DC voltage is larger than the operation voltage value, the first voltage detector turns on the operation switch. The second voltage detector has the first voltage value, and the second voltage detector is connected with the first electrical switch, the third electrical switch, the fifth electrical switch and the first capacitor, and the second voltage detector detects the first DC voltage, and when the first DC voltage is larger than the first voltage value, the second voltage detector turns on the first electrical switch, the third electrical switch and the fifth electrical switch. The third voltage detector has the second voltage value, and the third voltage detector is connected with the first capacitor through the fifth electrical switch, and connected with the second electrical switch and the fourth electrical switch, and when the first DC voltage is larger than the first voltage value, the third voltage detector detects the first DC voltage through the fifth electrical switch, and when the first DC voltage is larger than the second voltage value, the third voltage detector turns on the second electrical switch and the fourth electrical switch.

In an embodiment of the present invention, the device for harvesting and managing wireless energy further comprises a logic assembly, a reconfigurable DC to DC converter and a low dropout (LDO) linear regulator. The logic assembly is connected with the voltage detection circuit and receives a high-level digital signal, a low-level digital signal, a first clock signal and a second clock signal. A duty cycle of the first clock signal is equal to a duty cycle of the second clock signal. When the second clock signal is a low-level voltage, the first clock signal is a low-level voltage or a high-level voltage. When the second clock signal is a high-level voltage, the first clock signal is a low-level voltage. When the first DC voltage is larger than the operation voltage value, the voltage detection circuit drives the logic assembly to perform a logic operation on the high-level digital signal, the low-level digital signal, the first clock signal and the second clock signal to generate a plurality of first control digital signals. When the first DC voltage is larger than the first voltage value, the voltage detection circuit drives the logic assembly to perform a logic operation on the high-level digital signal, the low-level digital signal, the first clock signal and the second clock signal to generate a plurality of second control digital signals. When the first DC voltage is larger than the second voltage value, the voltage detection circuit drives the logic assembly to perform a logic operation on the high-level digital signal, the low-level digital signal, the first clock signal and the second clock signal to generate a plurality of third control digital signals. The reconfigurable DC to DC converter is connected with the logic assembly and the first capacitor and receives the first DC voltage, and the reconfigurable DC to DC converter receives the plurality of first control digital signals, the plurality of second control digital signals or the plurality of third control digital signals and uses them to convert the first DC voltage into a fourth DC voltage. The LDO linear regulator is connected with the reconfigurable DC to DC converter and the load, receives the fourth DC voltage and steps down the fourth DC voltage to generate an output DC voltage, and the LDO linear regulator transfer the output DC voltage to the load.

In an embodiment of the present invention, the fourth DC voltage is 1, $\frac{2}{3}$ or $\frac{1}{2}$ time of the first DC voltage.

In an embodiment of the present invention, the device for harvesting and managing wireless energy further comprises a dynamic impedance matching circuit connected with the first rectifier, the first electrical switch, the second electrical switch and the wireless receiver, and the dynamic impedance matching circuit comprises a variable capacitance circuit connected between the first rectifier and the wireless receiver and connected with the first electrical switch and the second electrical switch, and the dynamic impedance matching circuit has the operation voltage value and detects the first DC voltage, and the first rectifier receives the AC voltage through the variable capacitance circuit, and the first rectifier has an internal capacitor and a discharging switch connected in parallel and connected with the dynamic impedance matching circuit, and the discharging switch is turned off, and the first DC voltage applies a sensing voltage to the internal capacitor, and when the first DC voltage is larger than the operation voltage value, the dynamic impedance matching circuit turns on the discharging switch several times during a fixed period, so as to calculate several time durations that the sensing voltage rises from a low voltage to a high voltage, and the dynamic impedance matching circuit chooses the shortest one of the time durations and uses it to adjust a capacitive impedance value of the variable capacitance circuit to match input impedance of the first rectifier.

In an embodiment of the present invention, the dynamic impedance matching circuit further comprises an operation voltage detector, an AND gate and a controller. The operation voltage detector has the operation voltage value. The operation voltage detector is connected with the first rectifier, and detects the first DC voltage, and when the first DC voltage is larger than the operation voltage value, the operation voltage detector generates an operation digital signal. The AND gate is connected with the operation voltage detector, receives the operation digital signal and a third clock signal and uses them to generate an enable signal for the fixed period. The controller is connected with the AND gate, the discharging switch, the internal capacitor and the variable capacitance circuit, and receives the enable signal, the high voltage, the low voltage, the sensing voltage and a fourth clock signal, and the controller uses the enable signal and the fourth clock signal to calculate the time durations that the sensing voltage rises from the low voltage to the high voltage, and when the sensing voltage is larger than the high voltage, the controller instantaneously turns on the discharging switch to discharge the internal capacitor, and the controller chooses the shortest one of the time durations and uses it to adjust the capacitive impedance value of the variable capacitance circuit.

In an embodiment of the present invention, the device for harvesting and managing wireless energy further comprises a P-channel metal-oxide-semiconductor field effect transistor (PMOSFET) and an N-channel metal-oxide-semiconductor field effect transistor (NMOSFET). A drain of the PMOSFET is connected with the second capacitor, and a body and a source of the PMOSFET are connected. A drain of the NMOSFET is connected with the first capacitor, and a body and a source of the NMOSFET are connected, and the sources the PMOSFET and the NMOSFET are connected, and gates of the PMOSFET and the NMOSFET are respectively connected with the first capacitor and the second capacitor, and the PMOSFET and the NMOSFET prevents current from flowing from the first capacitor to the second capacitor, and when a voltage of the second capacitor is larger than the first DC voltage, the second capacitor provides electric energy for the first capacitor and the load through the PMOSFET and the NMOSFET.

Below, the embodiments are described in detail in cooperation with the drawings to make easily understand the technical contents, characteristics and accomplishments of the present invention.

DETAILED DESCRIPTION OF THE INVENTION

Figure 1:
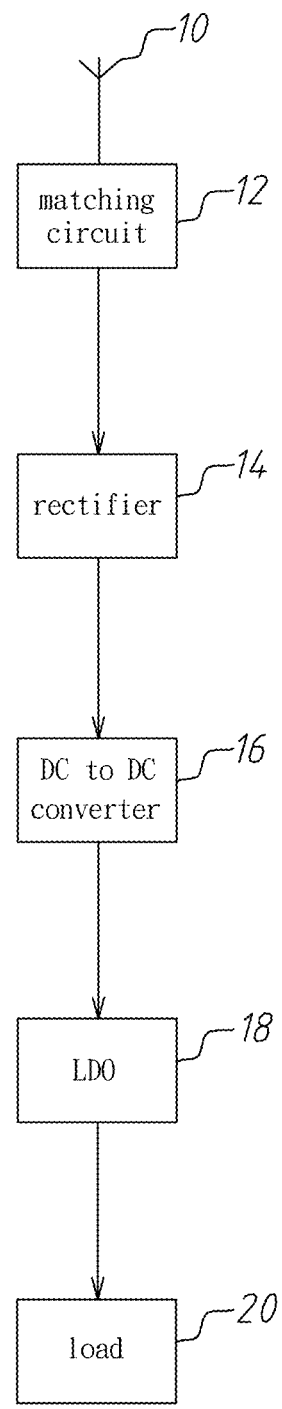
FIG. 1 is a diagram schematically showing a device for harvesting and managing wireless energy in a conventional technology.
Figure 2:
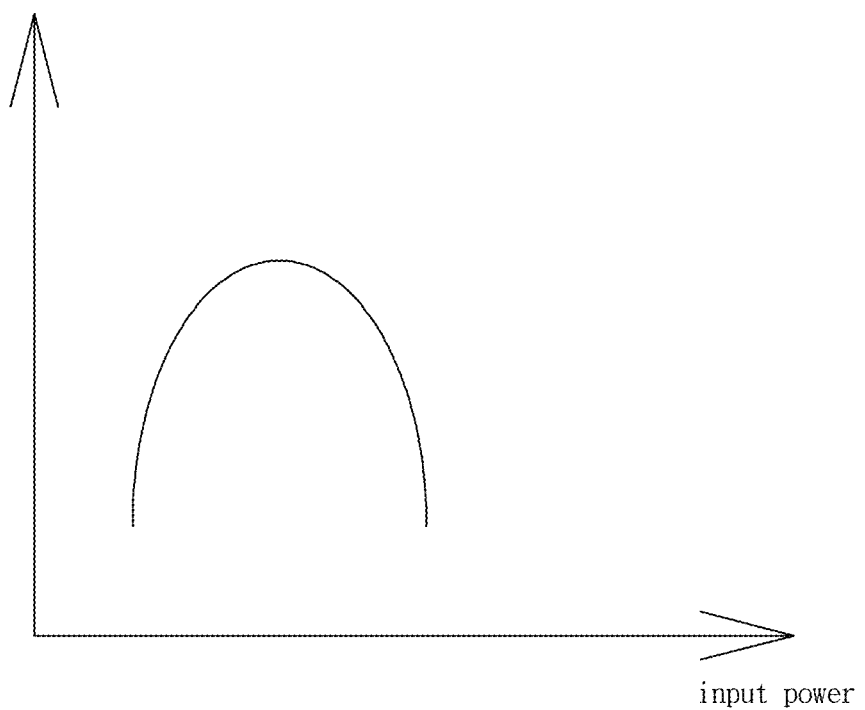
FIG. 2 is a diagram schematically showing a curve of energy conversion efficiency and input power in a conventional technology.

Reference will now be made in detail to embodiments illustrated in the accompanying drawings. Wherever possible, the same reference numbers are used in the drawings and the description to refer to the same or alike parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 3:
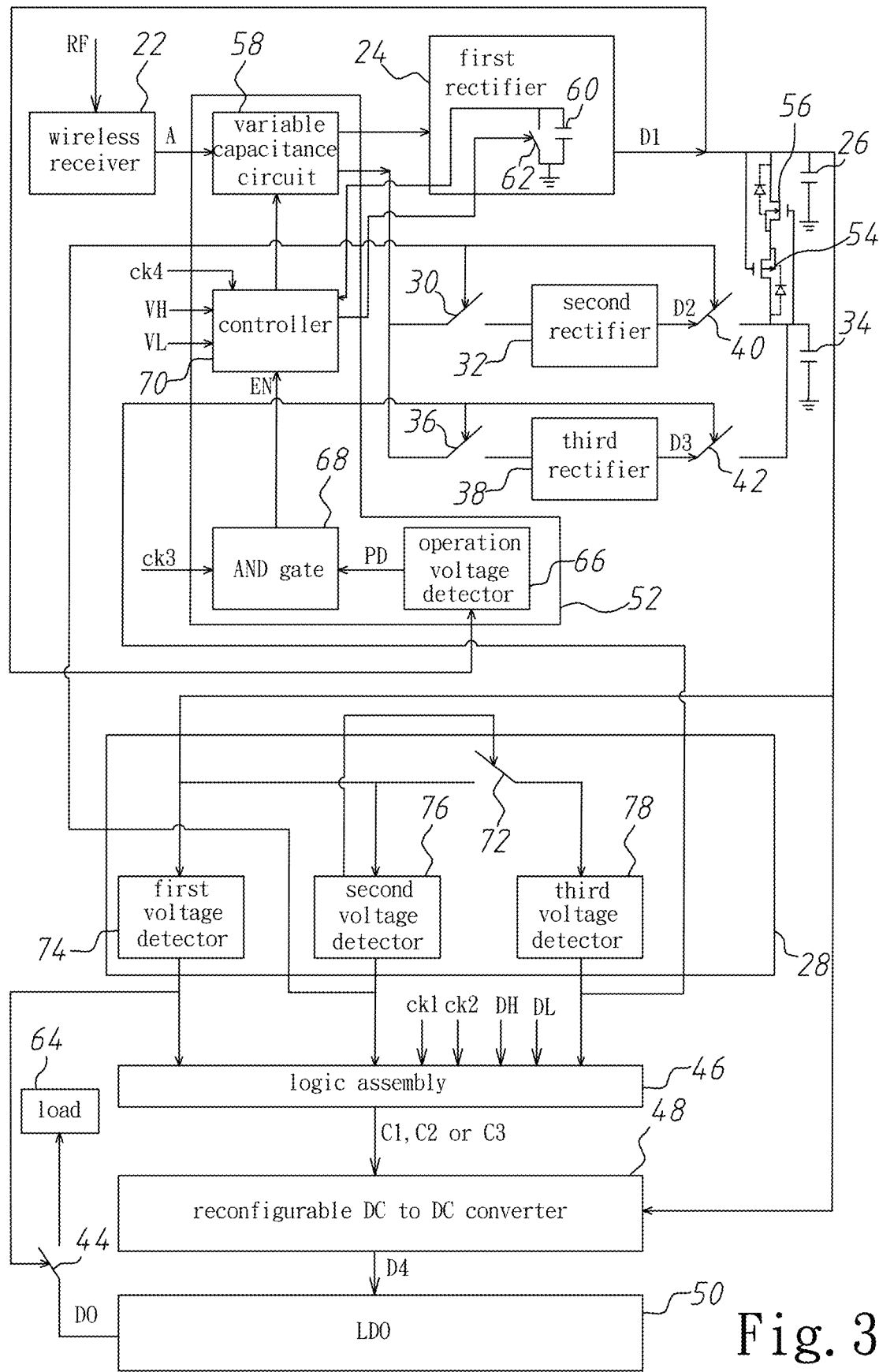
FIG. 3 is a diagram schematically showing a device for harvesting and managing wireless energy according to the first embodiment of the present invention.

Refer to FIG. 3. The first embodiment of the device for harvesting and managing wireless energy 20 of the present invention comprises a wireless receiver 22, a first rectifier 24, a first capacitor 26, a voltage detection circuit 28, a first electrical switch 30, a second rectifier 32, a second capacitor 34, a second electrical switch 36, a third rectifier 38, a third electrical switch 40, a fourth electrical switch 42, an operation switch 44, a logic assembly 46, a reconfigurable DC to DC converter 48, a low dropout linear regulator (LDO) 50, a dynamic impedance matching circuit 52, a P-channel metal oxide semiconductor field effect transistor (PMOSFET) 54 and an N-channel metal oxide semiconductor field effect transistor (NMOSFET) 56. For example, the wireless receiver is an antenna, and the dynamic impedance matching circuit 52 comprises a variable capacitance circuit 58 connected between the first rectifier 24 and the wireless receiver 22 and connected with the first electrical switch 30 and the second electrical switch 36. The first rectifier 24 has an internal capacitor 60 and a discharging switch 62 connected in parallel. The internal capacitor 60 and the discharging switch 62 are connected with the dynamic impedance matching circuit 52. The voltage detection circuit 28 has an operation voltage value, a first voltage value and a second voltage value. The dynamic impedance matching circuit 52 has the operation voltage value. The first voltage value is less than the second voltage value. The first voltage value is larger than the operation voltage value. For example, the operation voltage value, the first voltage value and the second voltage value are respectively 1.4 V, 2.1 V and 2.8 V. The first electrical switch 30, the second electrical switch 36, the third electrical switch 40, the fourth electrical switch 42 and the operation switch 44 are normally turned off.

The wireless receiver 22 receives a wireless radio-frequency (RF) signal RF and converts the wireless RF signal RF into an alternating-current (AC) voltage A with input power. The first rectifier 24 is connected with the wireless receiver 22, receives the AC voltage A and converts the AC voltage A into a first DC voltage D1. The first rectifier 24 is used as a main path. The first capacitor 26 is connected with the first rectifier 24 and a load 64, receives the first DC voltage D1 and provides the first DC voltage D1 for the load 64. For example, a rated voltage of the load 64 is 1.2 V. The voltage detection circuit 28 is connected with the first capacitor 26 and detects the first DC voltage D1. The operation switch 44 is connected between the load 64 and the first capacitor 26 and connected with the voltage detection circuit 28. When the first DC voltage D1 is larger than the operation voltage value, the voltage detection circuit 28 turns on the operation switch 44, and the first capacitor 26 provides the first DC voltage D1 for the load 64 through the operation switch 44.

The first electrical switch 30 is connected with the wireless receiver 22 and the voltage detection circuit 28, and the second rectifier 32 is connected with the wireless receiver 22 through the first electrical switch 30 and connected with the second capacitor 34. The second rectifier 32 is used as a new path. The third electrical switch 40 is connected between the second capacitor 34 and the second rectifier 32 and connected with the voltage detection circuit 28. The third electrical switch 40 turned off is used to prevent current from flowing to the second rectifier 32 through the third electrical switch 40. When the first DC voltage D1 is larger than the first voltage value, the voltage detection circuit 28 turns on the first electrical switch 30 and the third electrical switch 40, and the second rectifier 32 receives the AC voltage A through the first electrical switch 30 and converts the AC voltage A into a second DC voltage D2 to share the input power received by the first rectifier 24. Meanwhile, the second DC voltage D2 charges the second capacitor 34 through the third electrical switch 40.

The second electrical switch 36 is connected with the wireless receiver 22 and the voltage detection circuit 28, and the third rectifier 38 is connected with the wireless receiver 22 through the second electrical switch 36 and connected with the second capacitor 34. The third rectifier 38 is also used as a new path. The fourth electrical switch 42 is connected between the second capacitor 34 and the third rectifier 38 and connected with the voltage detection circuit 28. The fourth electrical switch 42 turned off is used to prevent current from flowing to the third rectifier 38 through the fourth electrical switch 42. When the first DC voltage D1 is larger than the second voltage value, the voltage detection circuit 28 turns on the second electrical switch 36 and the fourth electrical switch 42, and the third rectifier 38 receives the AC voltage A through the second electrical switch 36 and converts the AC voltage A into a third DC voltage D3 to share the input power received by the first rectifier 24 and the second rectifier 32. Meanwhile, the third DC voltage D3 charges the second capacitor 34 through the fourth electrical switch 42.

Figure 4:
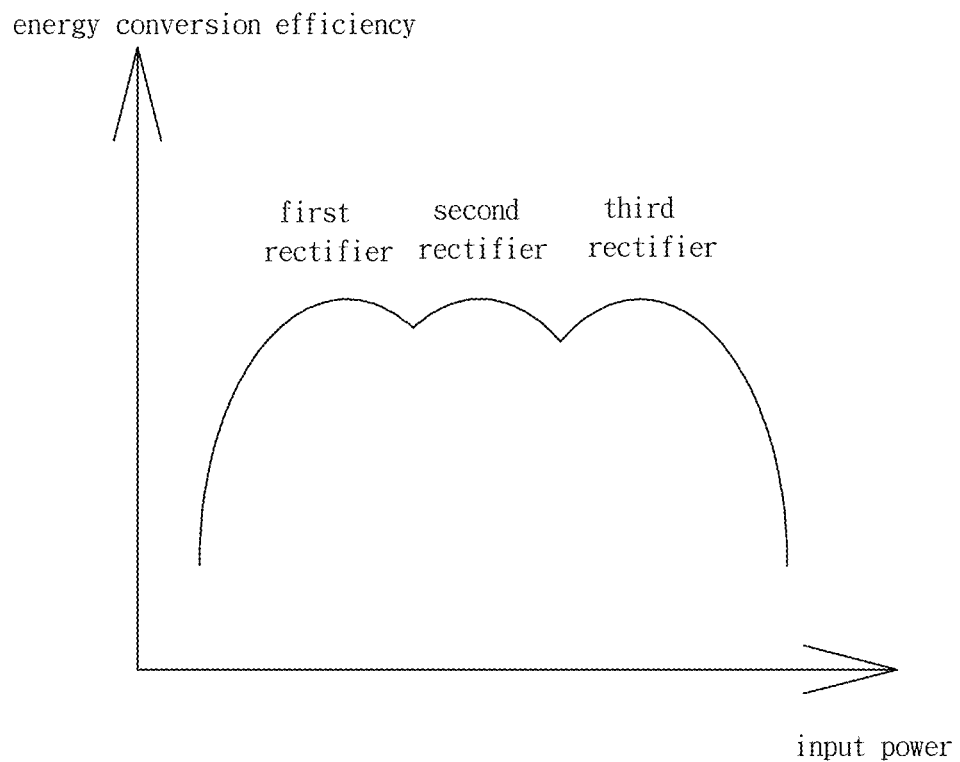
FIG. 4 is a diagram schematically showing a curve of energy conversion efficiency and input power according to an embodiment of the present invention.

Since the first DC voltage D1 is linearly proportional to the input power, the higher first DC voltage D1 represents the higher input power. When the first DC voltage D1 is larger than the first voltage value, the energy conversion efficiency produced by the main path is decreased, as represented by the first descending curve in FIG. 4. Thus, a new path corresponding to the second rectifier 32 is provided to share the input power originally received by the main path, thereby increasing the energy conversion efficiency corresponding to the main path, as represented by the second raising curve in FIG. 4. When the first DC voltage D1 is larger than the second voltage value, the energy conversion efficiency produced by the main path is decreased, as represented by the second descending curve in FIG. 4. Thus, a new path corresponding to the third rectifier 38 is provided to share the input power originally received by the main path and the new path corresponding to the second rectifier 32, thereby increasing the energy conversion efficiency corresponding to the main path, as represented by the third raising curve in FIG. 4. As a result, the present invention can extend the range of the input power that can achieve the high energy conversion efficiency.

A drain of the PMOSFET 54 is connected with the second capacitor 34, and a body and a source of the PMOSFET 54 are connected. A drain of the NMOSFET 56 is connected with the first capacitor 26, and a body and a source of the NMOSFET 56 are connected, and the sources the PMOSFET 54 and the NMOSFET 56 are connected, and gates of the PMOSFET 54 and the NMOSFET 56 are respectively connected with the first capacitor 26 and the second capacitor 34, and the PMOSFET 54 and the NMOSFET 56 prevents current from flowing from the first capacitor 26 to the second capacitor 34, and when a voltage of the second capacitor 34 is larger than the first DC voltage D1, the second capacitor 34 provides the stored electric energy for the first capacitor 26 and the load 64 through the PMOSFET 54 and the NMOSFET 56. In other words, when the input power is insufficiently provided to the load 64, the stored electric energy is provided to the load 64 to sustain the system operation.

The PMOSFET 54 and the NMOSFET 56 respectively have two parasitic diodes between the drains and the bodies. The parasitic diodes are represented by dashed lines. When the voltage of the second capacitor 34 is larger than the first DC voltage D1, the PMOSFET 54, the NMOSFET 56 and the parasitic diodes are forward biased. Thus, the conduction voltages of the PMOSFET 54 and the NMOSFET 56 are lower than those of conventional diodes, and the forward current of the PMOSFET 54 and the NMOSFET 56 is higher than that of the conventional diodes. When the voltage of the second capacitor 34 is less than the first DC voltage D1, the PMOSFET 54 and the NMOSFET 56 are respectively analog to two resistors, so that absolute values of gate-source voltages are very low. Thus, the PMOSFET 54 and the NMOSFET 56 are more tightly turned off.

The logic assembly 46 is connected with the voltage detection circuit 28 and receives a high-level digital signal DH, a low-level digital signal DL, a first clock signal ck1 and a second clock signal ck2. A duty cycle of the first clock signal ck1 is equal to a duty cycle of the second clock signal ck2. When the second clock signal ck2 is a low-level voltage, the first clock signal ck1 is a low-level voltage or a high-level voltage. When the second clock signal ck2 is a high-level voltage, the first clock signal ck1 is a low-level voltage. When the first DC voltage D1 is larger than the operation voltage value, the voltage detection circuit 28 drives the logic assembly 46 to perform a logic operation on the high-level digital signal DH, the low-level digital signal DL, the first clock signal ck1 and the second clock signal ck2 to generate a plurality of first control digital signals C1. When the first DC voltage D1 is larger than the first voltage value, the voltage detection circuit 28 drives the logic assembly 46 to perform a logic operation on the high-level digital signal DH, the low-level digital signal DL, the first clock signal ck1 and the second clock signal ck2 to generate a plurality of second control digital signals C2. When the first DC voltage D1 is larger than the second voltage value, the voltage detection circuit 28 drives the logic assembly 46 to perform a logic operation on the high-level digital signal DH, the low-level digital signal DL, the first clock signal ck1 and the second clock signal ck2 to generate a plurality of third control digital signals C3. The reconfigurable DC to DC converter 48 is connected with the logic assembly 46 and the first capacitor 26 and receives the first DC voltage D1, and the reconfigurable DC to DC converter 48 receives the plurality of first control digital signals C1, the plurality of second control digital signals C2 or the plurality of third control digital signals C3 and uses them to convert the first DC voltage D1 into a fourth DC voltage D4. For example, the fourth DC voltage D4 is 1, ⅔ or ½ time of the first DC voltage D1 to respectively correspond to the first control digital signals C1, the second control digital signals C2 and the third control digital signals C3. The LDO linear regulator 50 is connected with the reconfigurable DC to DC converter 48 and the load 64, receives the fourth DC voltage D4 and steps down the fourth DC voltage D4 to generate an output DC voltage DO, and the LDO linear regulator 50 transfers the output DC voltage DO to the load 64 through the operation switch 44 turned on.

The output DC voltage DO is set to 1.2 V. In order to decrease the power consumed by the LDO linear regulator 50, the reconfigurable DC to DC converter 48 uses the different values of the first DC voltage D1 to switch different conversion ratios of the DC voltage, so that the fourth DC voltage is close to the output DC voltage DO as much as possible. Thereby, the overall energy conversion efficiency is improved. For example, when the first DC voltage D1 is 1.4~2.1V, the fourth DC voltage D4 is equal to the first DC voltage D1. When the first DC voltage D1 is 2.1~2.8V, the fourth DC voltage D4 is ⅔ time of the first DC voltage D1. When the first DC voltage D1 is larger than 2.8V, the fourth DC voltage D4 is ½ time of the first DC voltage D1.

The dynamic impedance matching circuit 52 is connected with the first rectifier 24, the first electrical switch 30, the second electrical switch 36 and the wireless receiver 22, and the dynamic impedance matching circuit 52 detects the first DC voltage D1, and the first rectifier 24 receives the AC voltage A through the variable capacitance circuit 58. The discharging switch 62 is normally turned off, and the first DC voltage D1 applies a sensing voltage to the internal capacitor 60. When the first DC voltage D1 is larger than the operation voltage value, the dynamic impedance matching circuit 52 turns on the discharging switch 62 several times during a fixed period, so as to calculate several time durations that the sensing voltage rises from a low voltage VL to a high voltage VH. The dynamic impedance matching circuit 52 chooses the shortest one of the time durations and uses it to adjust a capacitive impedance value of the variable capacitance circuit 58 to match input impedance of the first rectifier 24. The shortest one of the time durations represents the highest input power. The variable capacitance circuit 58 consists of a plurality of cascaded circuits connected in parallel. Each cascaded circuit comprises a capacitor and a control switch connected in series. The dynamic impedance matching circuit 52 is connected with the control switch to switch the control switch, thereby adjusting the capacitive impedance value of the variable capacitance circuit 58. When the capacitive impedance value of the variable capacitance circuit 58 matches the input impedance of the first rectifier 24, the first rectifier 24 receives the AC voltage A without reflecting the AC voltage A to improve the overall energy conversion efficiency.

The dynamic impedance matching circuit 52 further comprises an operation voltage detector 66, an AND gate 68 and a controller 70, wherein the controller 70 consists of a comparator and a maximum power point tracker (MPPT). The operation voltage detector 66 has the operation voltage value. The operation voltage detector 66 is connected with the first rectifier 24 and detects the first DC voltage D1. When the first DC voltage D1 is larger than the operation voltage value, the operation voltage detector 66 generates an operation digital signal PD. The AND gate 68 is connected with the operation voltage detector 66, receives the operation digital signal PD and a third clock signal ck3 and uses them to generate an enable signal EN for the fixed period. The controller 70 is connected with the AND gate 68, the discharging switch 62, the internal capacitor 60 and the variable capacitance circuit 58, and receives the enable signal EN, the high voltage VH, the low voltage VL, the sensing voltage and a fourth clock signal ck4. The controller 70 uses the enable signal EN and the fourth clock signal ck4 to calculate the time durations that the sensing voltage rises from the low voltage VL to the high voltage VH. When the sensing voltage is larger than the high voltage VH, the controller 70 instantaneously turns on the discharging switch 62 to discharge the internal capacitor 60, and the controller 70 chooses the shortest one of the time durations and uses it to adjust the capacitive impedance value of the variable capacitance circuit 58.

The voltage detection circuit 28 further comprises a fifth electrical switch 72 turned off, a first voltage detector 74, a second voltage detector 76 and a third voltage detector 78. The first voltage detector 74 has the operation voltage value, and the first voltage detector 74 is connected with the logic assembly 46, the operation switch 44 and the first capacitor 26. The first voltage detector 74 detects the first DC voltage D1. When the first DC voltage D1 is larger than the operation voltage value, the first voltage detector 74 turns on the operation switch 44 and drives the logic assembly 46 to generate the first control digital signals C1. The second voltage detector 76 has the first voltage value, and the second voltage detector 76 is connected with the logic assembly 46, the first electrical switch 30, the third electrical switch 40, the fifth electrical switch 72 and the first capacitor 26, and the second voltage detector 76 detects the first DC voltage D1. When the first DC voltage D1 is larger than the first voltage value, the second voltage detector 76 turns on the first electrical switch 30, the third electrical switch 40 and the fifth electrical switch 72 and drives the logic assembly 46 to generate the second control digital signals C2. The third voltage detector 78 has the second voltage value, and the third voltage detector 78 is connected with the first capacitor 26 through the fifth electrical switch 72, and connected with the logic assembly 46, the second electrical switch 36 and the fourth electrical switch 42. When the first DC voltage D1 is larger than the first voltage value, the third voltage detector 78 detects the first DC voltage D1 through the fifth electrical switch 72. When the first DC voltage D1 is larger than the second voltage value, the third voltage detector 78 turns on the second electrical switch 36 and the fourth electrical switch 42 and drives the logic assembly 46 to generate the third control digital signals C3.

The operation of the first embodiment of the device for harvesting and managing wireless energy is introduced as below. Firstly, the wireless receiver 22 receives a wireless RF signal RF and converts the wireless RF signal RF into an AC voltage A with input power. The energy of the wireless RF signal RF becomes higher and higher with time. Then, the first rectifier 24 receives the AC voltage A and converts the AC voltage A into a first DC voltage D1. The first capacitor 26 receives and stores the first DC voltage D1. When the first DC voltage D1 is larger than the operation voltage value, the first voltage detector 74 turns on the operation switch 44 and drives the logic assembly 46 to perform a logic operation on the high-level digital signal DH, the low-level digital signal DL, the first clock signal ck1 and the second clock signal ck2 to generate a plurality of first control digital signals C1. The reconfigurable DC to DC converter 48 receives the first DC voltage D1 and the plurality of first control digital signals C1 and uses the first control digital signals C1 to convert the first DC voltage D1 into the second DC voltage D4. The LDO linear regulator 50 receives the fourth DC voltage D4 and steps down the fourth DC voltage D4 to generate an output DC voltage DO, and the LDO linear regulator 50 transfers the output DC voltage DO to the load 64 through the operation switch 44 turned on.

When the first DC voltage D1 is larger than the first voltage value, the second voltage detector 76 turns on the first electrical switch 30, the third electrical switch 40 and the fifth electrical switch 72. The second rectifier 32 receives the AC voltage A through the first electrical switch 30 and converts the AC voltage A into a second DC voltage D2 to share the input power received by the first rectifier 24. Meanwhile, the second DC voltage D2 charges the second capacitor 34 through the third electrical switch 40. The second voltage detector 76 drives the logic assembly 46 to perform a logic operation on the high-level digital signal DH, the low-level digital signal DL, the first clock signal ck1 and the second clock signal ck2 to generate a plurality of second control digital signals C2. The reconfigurable DC to DC converter 48 receives the first DC voltage D1 and the plurality of second control digital signals C2 and uses the second control digital signals C2 to convert the first DC voltage D1 into the second DC voltage D4. The LDO linear regulator 50 receives the fourth DC voltage D4 and steps down the fourth DC voltage D4 to generate an output DC voltage DO, and the LDO linear regulator 50 transfers the output DC voltage DO to the load 64 through the operation switch 44 turned on.

When the first DC voltage D1 is larger than the second voltage value, the third voltage detector 78 turns on the second electrical switch 36 and the fourth electrical switch 42. The third rectifier 38 receives the AC voltage A through the second electrical switch 36 and converts the AC voltage A into a third DC voltage D3 to share the input power received by the first rectifier 24 and the second rectifier 32. Meanwhile, the third DC voltage D3 charges the second capacitor 34 through the fourth electrical switch 42. The third voltage detector 78 drives the logic assembly 46 to perform a logic operation on the high-level digital signal DH, the low-level digital signal DL, the first clock signal ck1 and the second clock signal ck2 to generate a plurality of third control digital signals C3. The reconfigurable DC to DC converter 48 receives the first DC voltage D1 and the plurality of third control digital signals C3 and uses the third control digital signals C3 to convert the first DC voltage D1 into the second DC voltage D4. The LDO linear regulator 50 receives the fourth DC voltage D4 and steps down the fourth DC voltage D4 to generate an output DC voltage DO, and the LDO linear regulator 50 transfers the output DC voltage DO to the load 64 through the operation switch 44 turned on.

The timing that the dynamic impedance matching circuit 52 operates depends on the timing of generating the enable signal EN. As long as the enable signal is generated, the dynamic impedance matching circuit 52 starts to operate.

Figure 5:
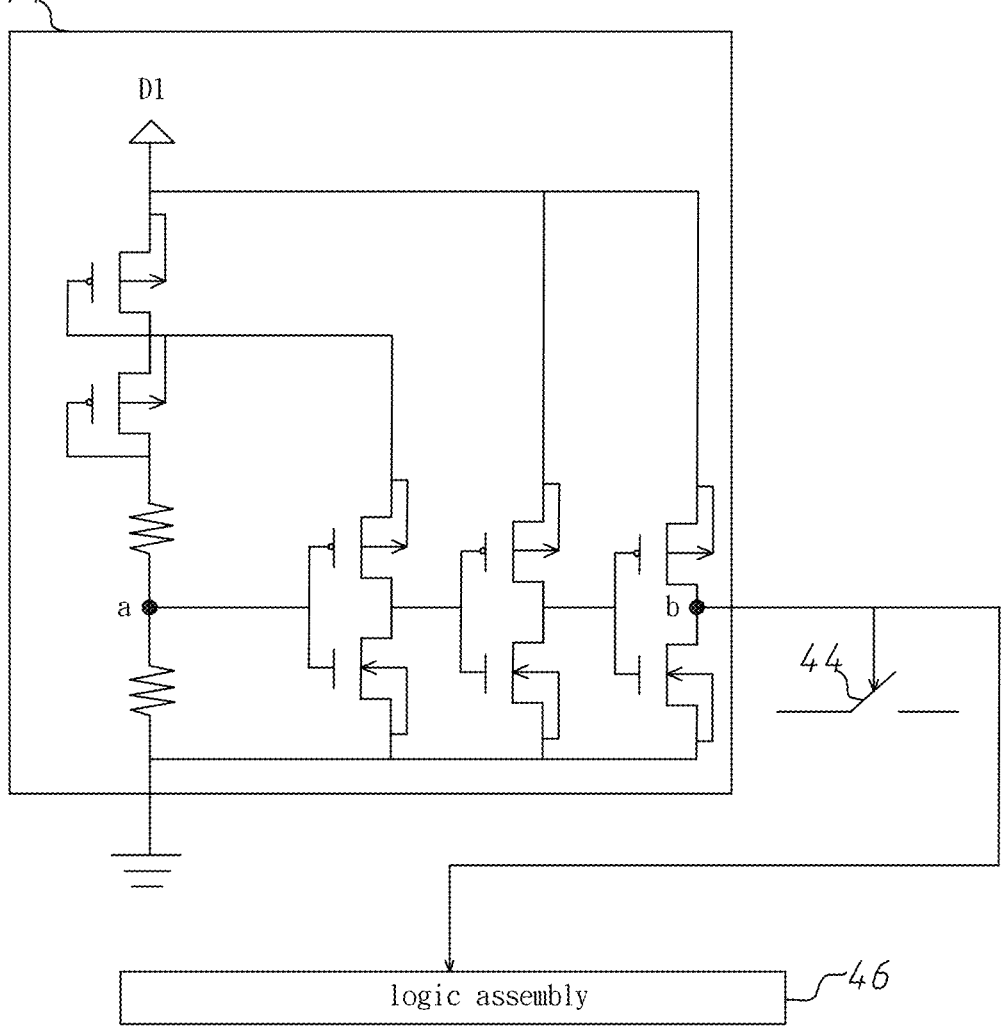
FIG. 5 is a diagram showing a first detector according to an embodiment of the present invention.

Refer to FIG. 5. The first voltage detector 74 comprises two cascoded PMOSFETs, two resistors and three inverters. When the first DC voltage D1 increases, a voltage of node a also increases. When the voltage of the node a is very low, a voltage of node b is almost equal to the first DC voltage D1. When the voltage of node a is larger than a voltage of a transition point of the inverter, the voltage of node b is zero. The voltage of the transition point is set to the operation voltage value and depends on the size of the inverter. The voltage of node b is used to turn on the operation switch 44 and drive the logic assembly 46.

Figure 6:
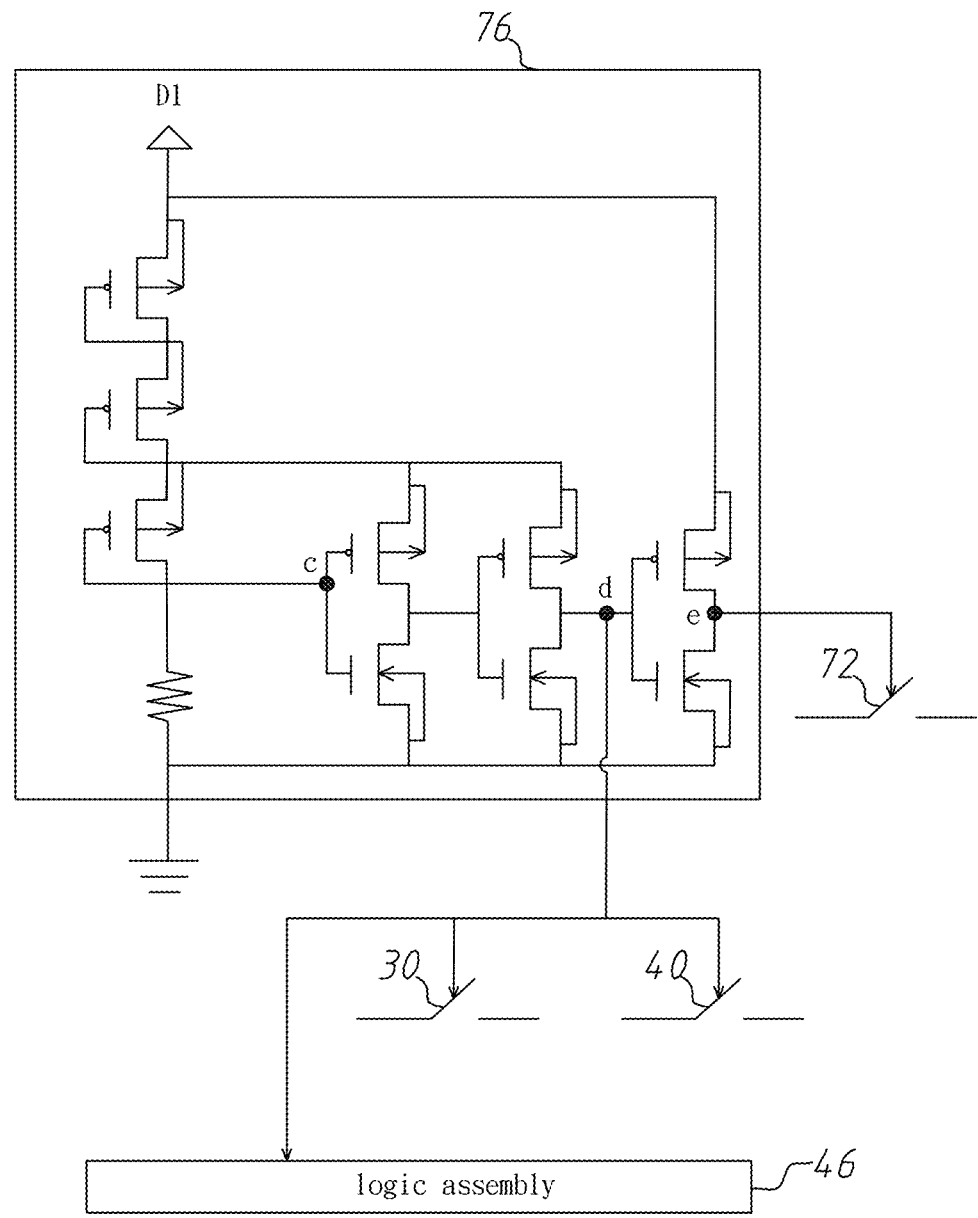
FIG. 6 is a diagram showing a second detector according to an embodiment of the present invention.

Refer to FIG. 6. The second voltage detector 76 comprises three cascoded PMOSFETs, one resistor and three inverters. When the first DC voltage D1 increases, a voltage of node c also increases. When the voltage of the node c is very low, a voltage of node d is zero. When the voltage of node c is larger than a voltage of a transition point of the inverter, the voltage of node d is almost equal to the first DC voltage D1, and a voltage of node e is zero. The voltage of the transition point is set to the first voltage value and depends on the size of the inverter. The voltage of node d is used to turn on the first electrical switch 30 and the third electrical switch 40 and drive the logic assembly 46. The voltage of node e is used to turn on the fifth electrical switch 72.

Figure 7:
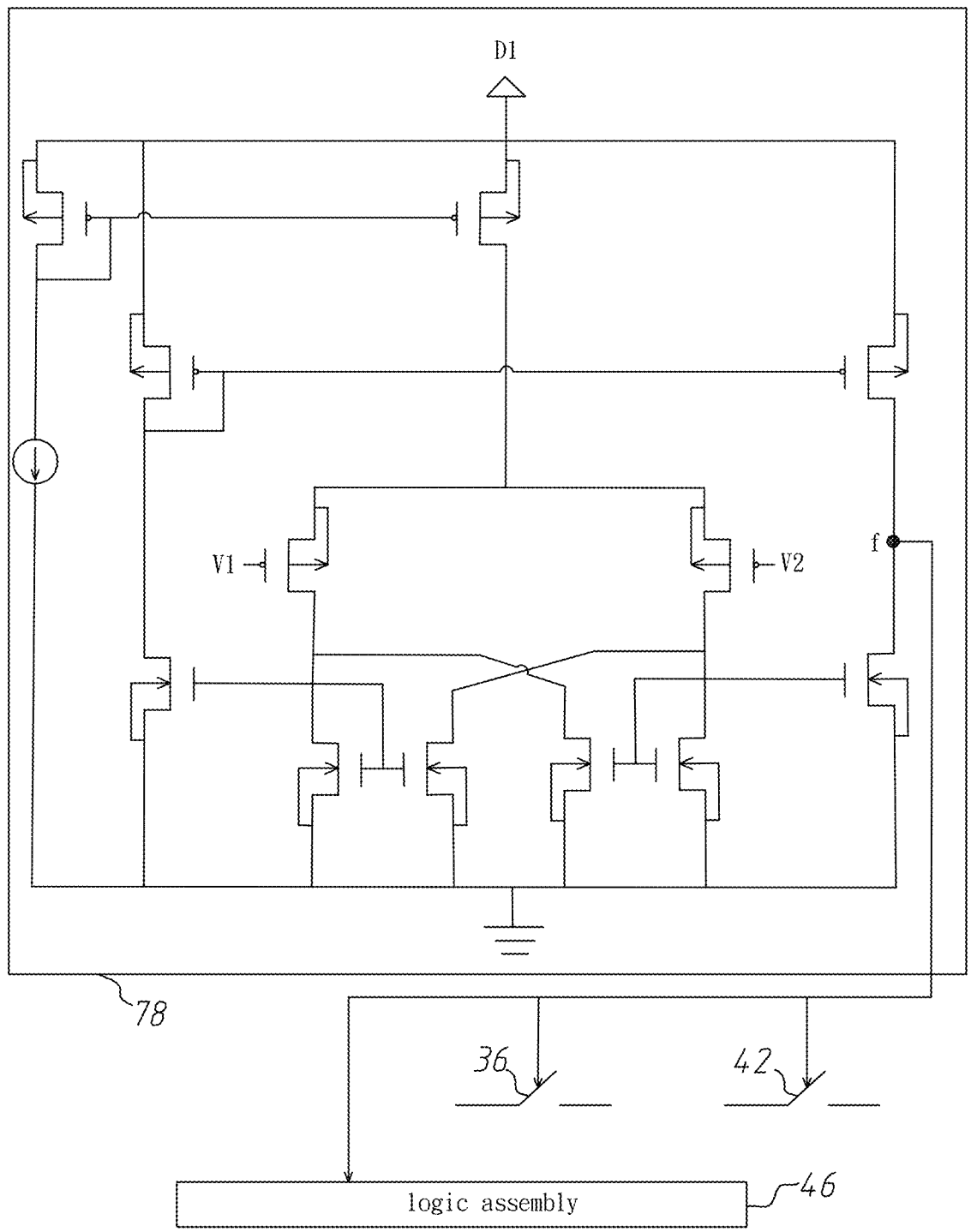
FIG. 7 is a diagram showing a third detector according to an embodiment of the present invention.

Refer to FIG. 7. The third voltage detector 78 comprises a plurality of MOSFETs and receives the first DC voltage D1, a first input voltage V1 and a second input voltage V2, wherein the second input voltage V2 is almost identical to the first DC voltage D1. The first input voltage V1 is a fixed value. The second voltage value depends on the first input voltage V1, the second input voltage V2 and the sizes of the MOSFFETs. When the first DC voltage D1 is less than or equal to the second voltage value, a voltage of node f is zero. When the first DC voltage D1 is larger than the second voltage value, the voltage of node f is almost equal to the first DC voltage D1. The voltage of node f is used to turn on the second electrical switch 36 and the fourth electrical switch 42 and drive the logic assembly 46.

Figure 8:
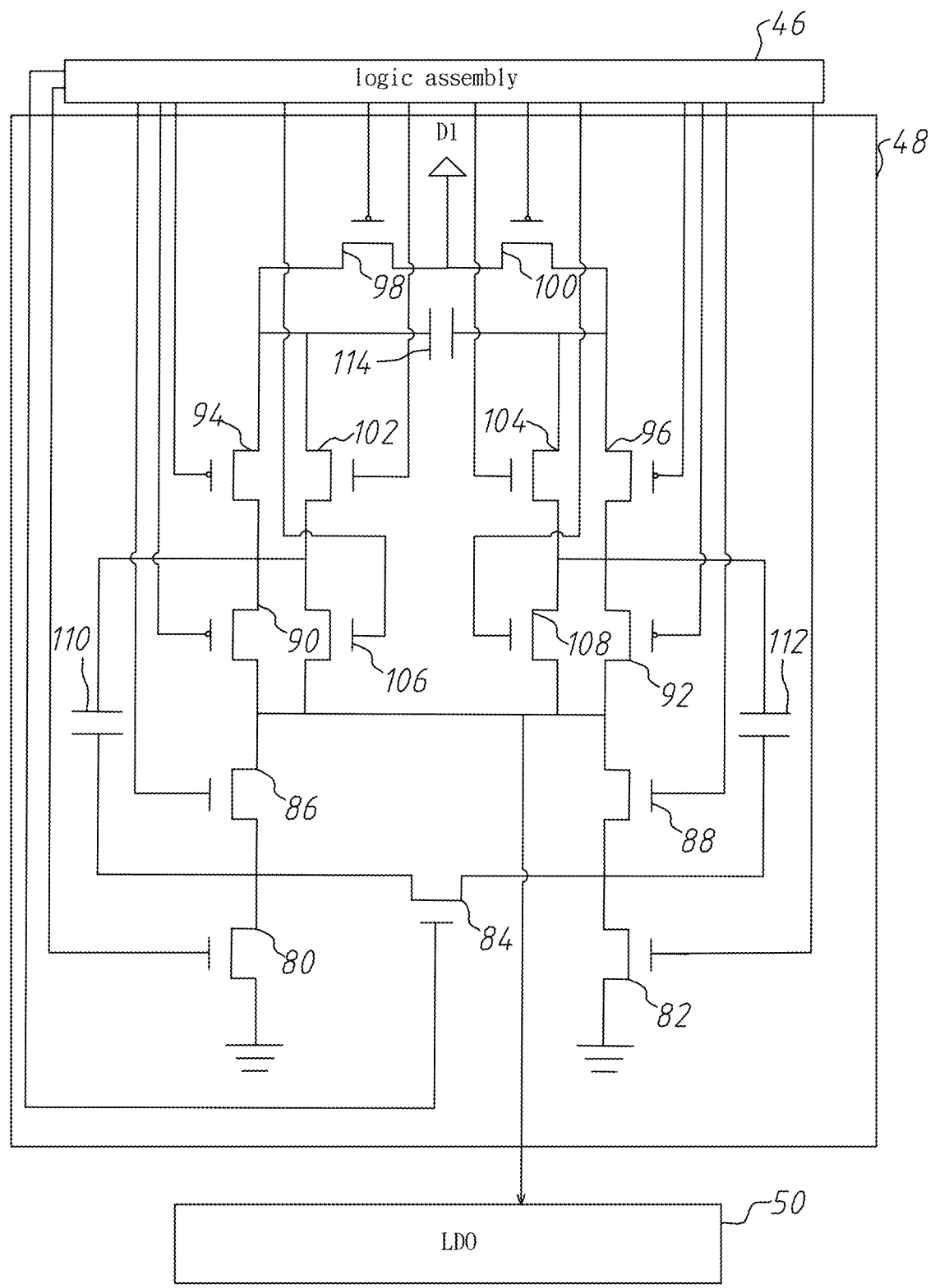
FIG. 8 is a diagram showing a reconfigurable DC to DC converter having 15 MOSFETs according to an embodiment of the present invention.

Refer to FIG. 3 and FIG. 8. The reconfigurable DC to DC converter 48 comprises a plurality of MOSFETs 80, 82, 84, 86, 88, 90, 92, 94, 96, 98, 100, 102, 104, 106 and 108 and a plurality of capacitors 110, 112 and 114. When the first DC voltage D1 is larger than the operation voltage value, gates of the MOSFETs 80, 82, 84, 86, 88, 90, 92, 94, 96, 98, 100, 102, 104, 106 and 108 respectively receive the high-level digital signal DH, the high-level digital signal DH, the low-level digital signal DL, the low-level digital signal DL, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1 and the inversed second clock signal ck2, whereby the fourth DC voltage D4 generated by the reconfigurable DC to DC converter 48 is equal to the first DC voltage D1. When the first DC voltage D1 is larger than the first voltage value, the gates of the MOSFETs 80, 82, 84, 86, 88, 90, 92, 94, 96, 98, 100, 102, 104, 106 and 108 respectively receive the low-level digital signal DL, the first clock signal ck1, the second clock signal ck2, the first clock signal ck1, the low-level digital signal DL, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1 and the inversed second clock signal ck2, whereby the fourth DC voltage D4 generated by the reconfigurable DC to DC converter 48 is ⅔ time of the first DC voltage D1. When the first DC voltage D1 is larger than the second voltage value, the gates of the MOSFETs 80, 82, 84, 86, 88, 90, 92, 94, 96, 98, 100, 102, 104, 106 and 108 respectively receive the second clock signal ck2, the first clock signal ck1, the low-level digital signal DL, the first clock signal ck1, the second clock signal ck2, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1 and the inversed second clock signal ck2, whereby the fourth DC voltage D4 generated by the reconfigurable DC to DC converter 48 is ½ time of the first DC voltage D1.

Figure 9:
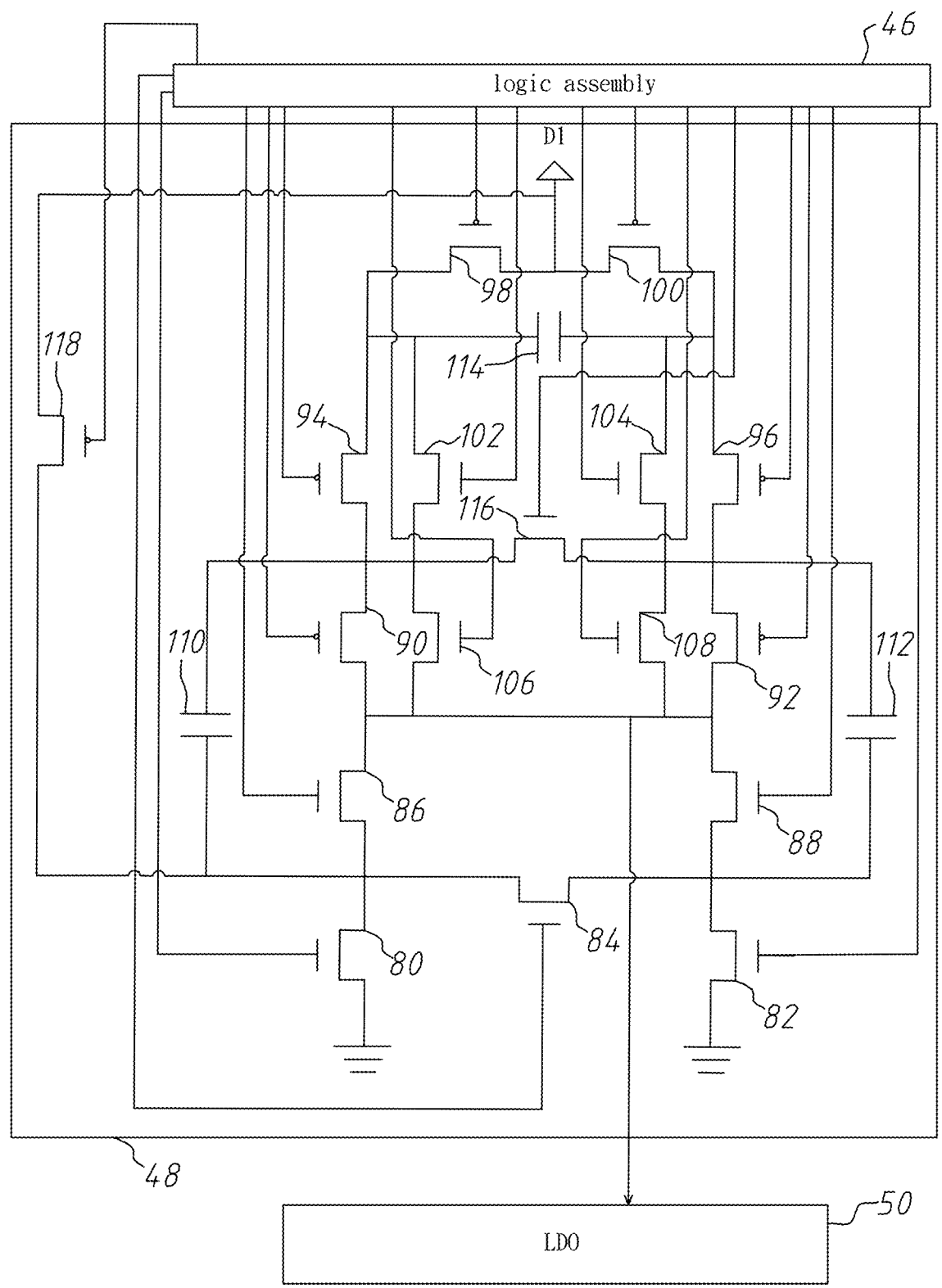
FIG. 9 is a diagram showing a reconfigurable DC to DC converter having 17 MOSFETs according to an embodiment of the present invention.

Besides, the reconfigurable DC to DC converter 48 cans switch six conversion ratios of the DC voltage. Refer to FIG. 3 and FIG. 9. The reconfigurable DC to DC converter 48 comprises a plurality of MOSFETs 80, 82, 84, 86, 88, 90, 92, 94, 96, 98, 100, 102, 104, 106, 108, 116 and 118 and a plurality of capacitors 110, 112 and 114. When the first DC voltage D1 is larger than the operation voltage value, the gates of the MOSFETs 80, 82, 84, 86, 88, 90, 92, 94, 96, 98, 100, 102, 104, 106, 108, 116 and 118 respectively receive the high-level digital signal DH, the high-level digital signal DH, the low-level digital signal DL, the low-level digital signal DL, the low-level digital signal DL, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1, the inversed second clock signal ck2, the low-level digital signal DL and the high-level digital signal DH whereby the fourth DC voltage D4 generated by the reconfigurable DC to DC converter 48 is equal to the first DC voltage D1. When the first DC voltage D1 is larger than the first voltage value, the gates of the MOSFETs 80, 82, 84, 86, 88, 90, 92, 94, 96, 98, 100, 102, 104, 106, 108, 116 and 118 respectively receive the low-level digital signal DL, the first clock signal ck1, the second clock signal ck2, the first clock signal ck1, the low-level digital signal DL, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1, the inversed second clock signal ck2, the low-level digital signal DL and the high-level digital signal DH, whereby the fourth DC voltage D4 generated by the reconfigurable DC to DC converter 48 is ⅔ time of the first DC voltage D1. When the first DC voltage D1 is larger than the second voltage value, the gates of the MOSFETs 80, 82, 84, 86, 88, 90, 92, 94, 96, 98, 100, 102, 104, 106, 108, 116 and 118 respectively receive the second clock signal ck2, the first clock signal ck1, the low-level digital signal DL, the first clock signal ck1, the second clock signal ck2, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1, the inversed second clock signal ck2, the low-level digital signal DL and the high-level digital signal DH, whereby the fourth DC voltage D4 generated by the reconfigurable DC to DC converter 48 is ½ time of the first DC voltage D1.

The gates of the MOSFETs 80, 82, 84, 86, 88, 90, 92, 94, 96, 98, 100, 102, 104, 106, 108, 116 and 118 respectively receive the second clock signal ck2, the first clock signal ck1, the low-level digital signal DL, the first clock signal ck1, the second clock signal ck2, the first clock signal ck1, the high-level digital signal DH, the high-level digital signal DH, the first clock signal ck1, the low-level digital signal DL, the second clock signal ck2, the low-level digital signal DL, the inversed first clock signal ck1, the inversed first clock signal ck1, the low-level digital signal DL, the inversed first clock signal ck1 and the high-level digital signal DH, whereby the fourth DC voltage D4 generated by the reconfigurable DC to DC converter 48 is ⅓ time of the first DC voltage D1.

The gates of the MOSFETs 80, 82, 84, 86, 88, 90, 92, 94, 96, 98, 100, 102, 104, 106, 108, 116 and 118 respectively receive the second clock signal ck2, the first clock signal ck1, the low-level digital signal DL, the first clock signal ck1, the second clock signal ck2, the first clock signal ck1, the high-level digital signal DH, the second clock signal ck2, the first clock signal ck1, the first clock signal ck1, the second clock signal ck2, the inversed second clock signal ck2, the inversed first clock signal ck1, the inversed first clock signal ck1, the low-level digital signal DL, the first clock signal ck1 and the high-level digital signal DH, whereby the fourth DC voltage D4 generated by the reconfigurable DC to DC converter 48 is ⅖ time of the first DC voltage D1.

The gates of the MOSFETs 80, 82, 84, 86, 88, 90, 92, 94, 96, 98, 100, 102, 104, 106, 108, 116 and 118 respectively receive the first clock signal ck1, the high-level digital signal DH, the low-level digital signal DL, the low-level digital signal DL, the low-level digital signal DL, the first clock signal ck1, the second clock signal ck2, the second clock signal ck2, the first clock signal ck1, the first clock signal ck1, the second clock signal ck2, the inversed second clock signal ck2, the inversed first clock signal ck1, the inversed first clock signal ck1, the inversed second clock signal ck2, the low-level digital signal DL and the first clock signal ck1, whereby the fourth DC voltage D4 generated by the reconfigurable DC to DC converter 48 is 3/2 time of the first DC voltage D1.

Figure 10:
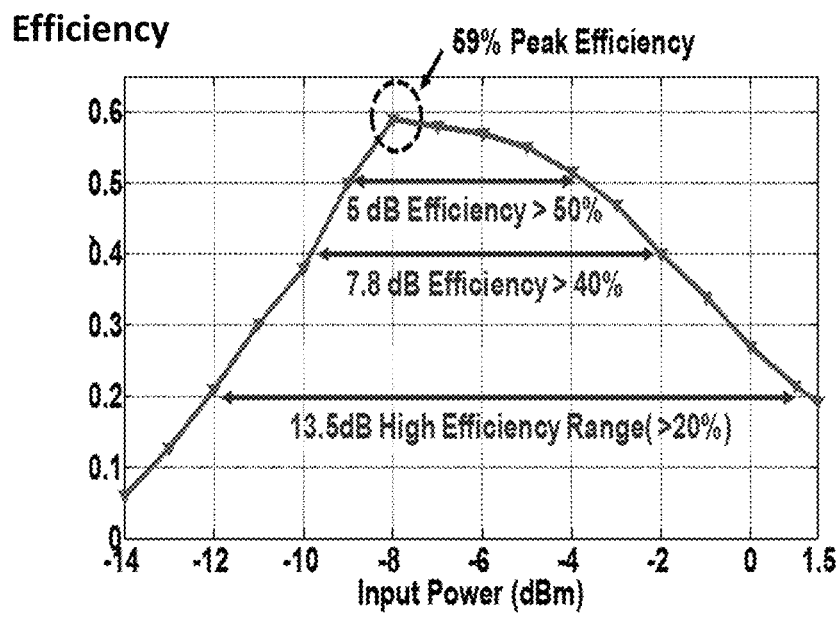
FIG. 10 is a diagram showing measurement results of RF/DC conversion efficiency of the present invention.

Refer to FIG. 10. FIG. 10 shows the measured power conversion efficiency (PCE) of the multiple-path rectifier at various input power levels. The measured input power range of PCE above 50%, 40%, and 20% is more than 5 dB, 7.8 dB, and 13.5 dB, respectively. The multipath rectifier achieves a 59% peak RF-DC conversion efficiency and −11.6 dBm sensitivity for an output voltage of 1.4V at a 100 kΩ load.

Figure 11:
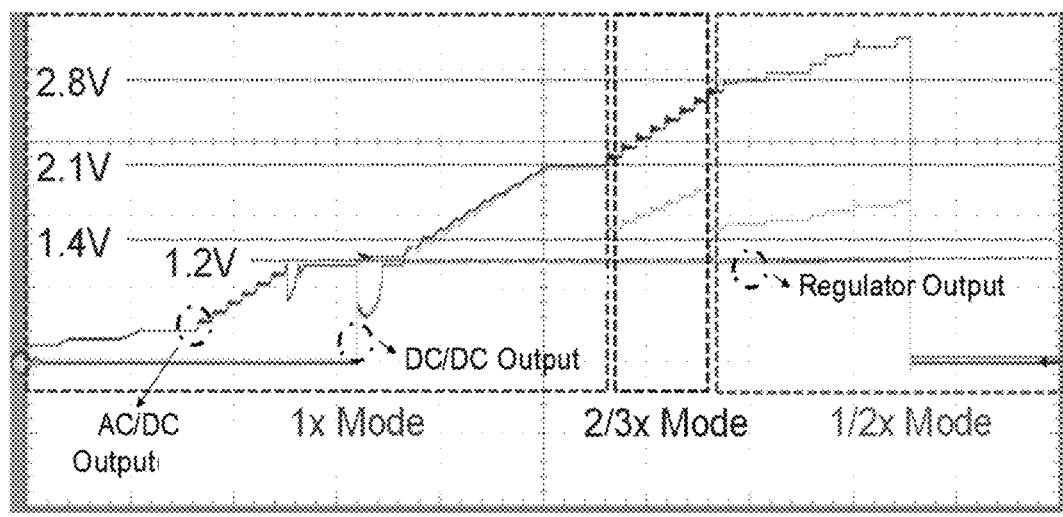
FIG. 11 is a diagram showing measured output voltage waveforms at various input power levels.

Refer to FIG. 11. FIG. 11 shows the mode-switching waveforms at different input power levels. In the present invention, the output regulated voltage is 1.2V and the minimum supply voltage to the LDO linear regulator is 1.4V. The DC-DC conversion ratio is switched to ⅔ and ½ at a rectified voltage of 2.1V and 2.8V, respectively.

Figure 12:
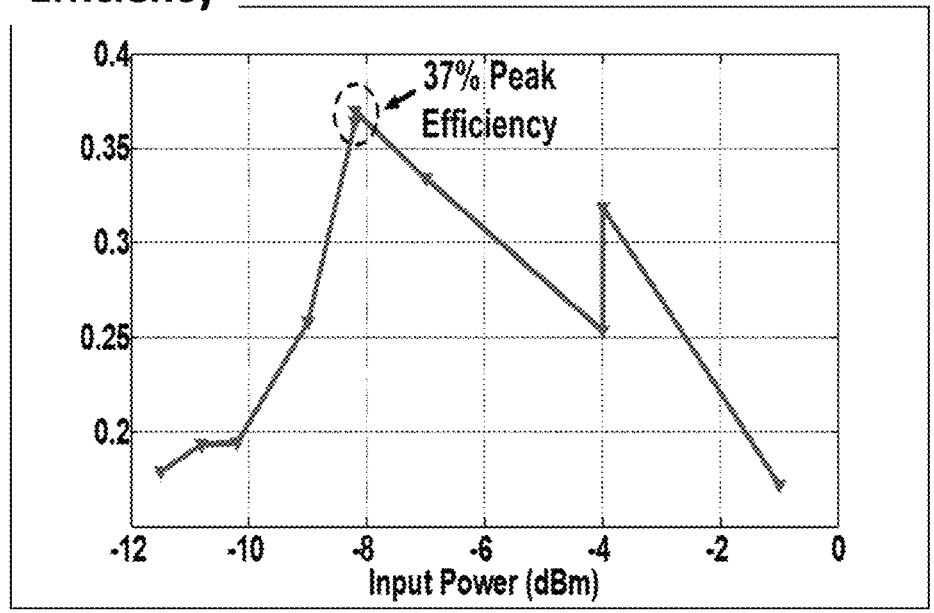
FIG. 12 is a diagram showing the power conversion efficiency (PCE) of a device for harvesting and managing wireless energy.

FIG. 12 shows the measured PCE of the entire device for harvesting and managing wireless energy. At the high input voltage condition, the proposed DC/DC converter architecture improves conversion efficiency by about 15% when compared to conventional regulator architectures, and the fully integrated device achieves a peak efficiency of 37% at about −8 dBm input power. Table I and Table II depict the performance summary and comparison to the state-of-the-art of the wide-range RF energy harvesting system. The present invention, fully integrated with a multi-path rectifier, a reconfigurable DC-DC converter, and an LDO linear regulator in a single chip, achieves good conversion efficiency over wide-range RF power when compared to other works in the literature.

TABLE I

| Tech. | No. of Stages | Rectifier Peak PCE @ $R_L$ | Range (PCE >20%) | Sensitivity | Output Voltage | Full Integration |
|---|---|---|---|---|---|---|
| TCAS I 15' | 130 nm | 1 | 53.4% @147 KΩ | N.A. | -12 dBm @0.43 V (144 KΩ) | 2 V (Regulated) | No (Off-Chip Inductor) |
| TCAS II 16' | 65 nm | 5 | 36.5% @147 KΩ | 11 dB | -16.5 dBm @1 V (147 KΩ) | Non-Regulated | Yes |
| The present invention | 180 nm | 5 | 59% @100 KΩ | 13.5 dB | -11.6 dBm @1.4 V (100 KΩ) | 1.2 V (Regulated) | Yes |

TABLE II

| | Regulation Type | End-to-End Peak Efficiency |
|---|---|---|
| TCAS I 15' | Inductor-Based DC/DC Converter | 44.1% (Rectifier + DC/DC Converter) |
| TCAS II 16' | N.A. | 36.5% (only Rectifier) |
| The present invention | SC Converter + LDO | 37% (Rectifier + reconfigurable DC/DC Converter + LDO) |

Figure 13:
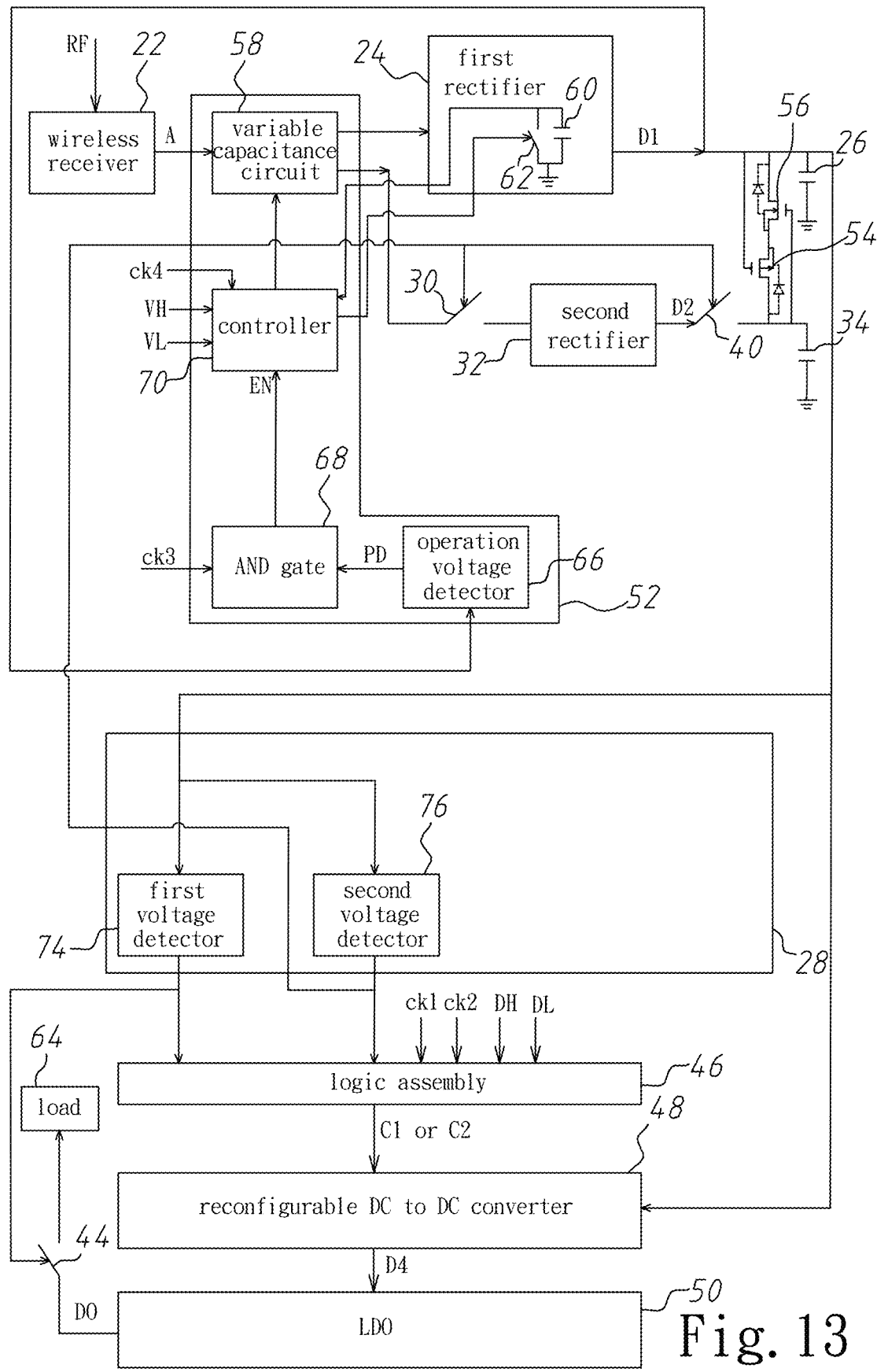
FIG. 13 is a diagram schematically showing a device for harvesting and managing wireless energy according to the second embodiment of the present invention.

The second embodiment of the device for harvesting and managing wireless energy of the present invention is introduced as below. Refer to FIG. 13. The second embodiment is different from the first embodiment in that the second embodiment lacks the rectifier 38, the second electrical switch 36, the fourth electrical switch 42 and the third voltage detector 78 and the operations thereof. The operations of the other elements are the same to those of the first embodiment so will not be reiterated. The second embodiment can also extend the range of the input power which achieves the high energy conversion efficiency and improve the sensitivity for harvesting wireless energy and the overall energy conversion efficiency.

In an Electronic Toll Collection (ETC) system, when a RF tag approaches a reader, the RF tag communicates with the reader. The reader has to deliver high power to communicate with the RF tag in the far distance. However, this behavior can waste energy due to the path loss and antenna efficiency. The device for harvesting and managing wireless energy of the present invention is applied to the ETC system. When the car provided with the device for harvesting and managing wireless energy and the RF tag approaches the reader, a transmission distance starts to be shortened and the input power of the RF signal endlessly varies. Thus, the device for harvesting and managing wireless energy switches multiple paths to maintain the high energy conversion efficiency. Before the car reaches the next reader, the input power is insufficient due to too far transmission distance. As a result, the device for harvesting and managing wireless energy can use the stored energy to drive the RF tag to communicate with the reader. The present invention uses the technology for distributing energy and switching paths to improve the overall energy conversion efficiency, harvest more energy and store additional energy, lest energy be wasted when the high input power is received. The present invention obtains the higher benefit without batteries having large volume and high cost.

The present invention can improve the energy conversion efficiency of an implantable chip without batteries. Since skins and hypodermis of people are different and the implantable chips are arranged in the different depths of hypodermis, the input power received by the implantable chips is not easily controlled to affect the energy conversion efficiency. The present invention can improve the problem with unstable efficiency.

The present invention also applies to the wireless charging field. Presently, the wireless charging technology uses energy coupling to transmit energy form power sourcing equipment (PSE) to a powered device. However, a charging distance and an obstruction between the PSE and the PD will affect the input power and the charging efficiency. The present invention can switch multiple paths to improve the charging efficiency.

In conclusion, the present invention switches multiple paths, saves extra energy using energy distribution scheme, provides several conversion ratios of the DC voltage and adjusts the capacitive impedance value of the variable capacitance circuit to extend the range of the input power that can achieve the high energy conversion efficiency, and improve the sensitivity for harvesting wireless energy and the overall energy conversion efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A device for harvesting and managing wireless energy comprising:
    a wireless receiver receiving a wireless radio-frequency (RF) signal and converting said wireless RF signal into an alternating-current (AC) voltage with input power;
    a first rectifier, coupled to said wireless receiver, receiving said AC voltage and converting said AC voltage into a first direct-current (DC) voltage;
    a first capacitor, coupled to said first rectifier and a load, receiving said first DC voltage and providing said first DC voltage for said load;
    a voltage detection circuit having a first voltage value, said voltage detection circuit being coupled to said first capacitor and detecting said first DC voltage;
    a first electrical switch coupled to said wireless receiver and said voltage detection circuit, said first electrical switch being initially turned off, wherein said voltage detection circuit turns on said first electrical switch responsive to input signal power of said wireless RF signal received by said wireless receiver when said first DC voltage is larger than said first voltage value;

a second rectifier coupled to said wireless receiver through said first electrical switch, and when said first DC voltage is larger than said first voltage value, said second rectifier selectively receiving said AC voltage through said first electrical switch when said first electrical switch is turned on, and converting said AC voltage into a second DC voltage to share said input power received by said first rectifier;

a third rectifier coupled to said wireless receiver through a second electrical switch for selectively converting said AC voltage into a third DC voltage to share said input power received by said first rectifier and said second rectifier; and a second capacitor selectively coupled to said second rectifier through a third electrical switch, and said second DC voltage charging said second capacitor;

wherein the energy conversion efficiency of the device for harvesting and managing wireless energy is adaptively optimized for variations in input signal power.

2. A device for harvesting and managing wireless energy comprising:

a wireless receiver receiving a wireless radio-frequency (RF) signal and converting said wireless RF signal into an alternating-current (AC) voltage with input power;

a first rectifier, connected with said wireless receiver, receiving said AC voltage and converting said AC voltage into a first direct-current (DC) voltage;

a first capacitor, connected with said first rectifier and a load, receiving said first DC voltage and providing said first DC voltage for said load;

a voltage detection circuit having a first voltage value, said voltage detection circuit being connected with said first capacitor and detecting said first DC voltage;

a first electrical switch connected with said wireless receiver and said voltage detection circuit, and said first electrical switch being turned off initially, and when said first DC voltage is larger than said first voltage value, said voltage detection circuit turning on said first electrical switch;

a second rectifier connected with said wireless receiver through said first electrical switch, and when said first DC voltage is larger than said first voltage value, said second rectifier receiving said AC voltage through said first electrical switch, and converting said AC voltage into a second DC voltage to share said input power received by said first rectifier;

a second capacitor connected with said second rectifier, said second DC voltage charging said second capacitor;

a second electrical switch connected with said wireless receiver and said voltage detection circuit, wherein said second electrical switch is turned off initially, said voltage detection circuit has a second voltage value, and said first voltage value is less than said second voltage value, and when said first DC voltage is larger than said second voltage value, said voltage detection circuit turns on said second electrical switch; and a third rectifier connected with said wireless receiver through said second electrical switch and connected with said second capacitor, wherein when said first DC voltage is larger than said second voltage value, said third rectifier receives said AC voltage through said second electrical switch and converts said AC voltage into a third DC voltage to share said input power received by said first rectifier and said second rectifier, and said third DC voltage charges said second capacitor.

3. The device for harvesting and managing wireless energy according to claim 2, further comprising:

a third electrical switch connected between said second capacitor and said second rectifier, and connected with said voltage detection circuit, wherein said third electrical switch is turned off initially, and when said first DC voltage is larger than said first voltage value, said voltage detection circuit turns on said third electrical switch, and said second DC voltage charges said second capacitor through said third electrical switch; and a fourth electrical switch connected between said second capacitor and said third rectifier, and connected with said voltage detection circuit, wherein said fourth electrical switch is turned off initially, and when said first DC voltage is larger than said second voltage value, said voltage detection circuit turns on said fourth electrical switch, and said third DC voltage charges said second capacitor through said fourth electrical switch.

4. The device for harvesting and managing wireless energy according to claim 3, further comprising an operation switch connected between said load and said first capacitor, and connected with said voltage detection circuit, wherein said voltage detection circuit has an operation voltage value, said first voltage value is larger than said operation voltage value, and when said first DC voltage is larger than said operation voltage value, said voltage detection circuit turns on said operation switch, and said first capacitor provides said first DC voltage for said load through said operation switch.

5. The device for harvesting and managing wireless energy according to claim 4, wherein said voltage detection circuit further includes:

a fifth electrical switch initially turned off;

a first voltage detector having said operation voltage value, wherein said first voltage detector is connected with said operation switch and said first capacitor, said first voltage detector detects said first DC voltage, and when said first DC voltage is larger than said operation voltage value, said first voltage detector turns on said operation switch;

a second voltage detector having said first voltage value, wherein said second voltage detector is connected with said first electrical switch, said third electrical switch, said fifth electrical switch and said first capacitor, said second voltage detector detects said first DC voltage, and when said first DC voltage is larger than said first voltage value, said second voltage detector turns on said first electrical switch, said third electrical switch and said fifth electrical switch; and a third voltage detector having said second voltage value, wherein said third voltage detector is connected with said first capacitor through said fifth electrical switch, and connected with said second electrical switch and said fourth electrical switch, and when said first DC voltage is larger than said first voltage value, said third voltage detector detects said first DC voltage through said fifth electrical switch, and when said first DC voltage is larger than said second voltage value, said third voltage detector turns on said second electrical switch and said fourth electrical switch.

6. The device for harvesting and managing wireless energy according to claim 4, further comprising:

a logic assembly, connected with said voltage detection circuit, receiving a high-level digital signal, a low-level digital signal, a first clock signal and a second clock signal, wherein a duty cycle of said first clock signal is equal to a duty cycle of said second clock signal, and when said second clock signal is a low-level voltage, said first clock signal is a low-level voltage or a high-level voltage, and when said second clock signal is a high-level voltage, said first clock signal is a low-level voltage, and when said first DC voltage is larger than said operation voltage value, said voltage detection circuit drives said logic assembly to perform a logic operation on said high-level digital signal, said low-level digital signal, said first clock signal and said second clock signal to generate a plurality of first control digital signals, and when said first DC voltage is larger than said first voltage value, said voltage detection circuit drives said logic assembly to perform a logic operation on said high-level digital signal, said low-level digital signal, said first clock signal and said second clock signal to generate a plurality of second control digital signals, and when said first DC voltage is larger than said second voltage value, said voltage detection circuit drives said logic assembly to perform a logic operation on said high-level digital signal, said low-level digital signal, said first clock signal and said second clock signal to generate a plurality of third control digital signals;

a reconfigurable DC to DC converter connected with said logic assembly and said first capacitor, receiving said first DC voltage, wherein said reconfigurable DC to DC converter receives said plurality of first control digital signals, said plurality of second control digital signals or said plurality of third control digital signals and uses them to convert said first DC voltage into a fourth DC voltage; and a low dropout (LDO) linear regulator, connected with said reconfigurable DC to DC converter and said load, receiving said fourth DC voltage and stepping down said fourth DC voltage to generate an output DC voltage, wherein said LDO linear regulator transfers said output DC voltage to said load.

7. The device for harvesting and managing wireless energy according to claim 6, wherein said fourth DC voltage is equal to, ⅔ of, or ½ of said first DC voltage in value.

8. The device for harvesting and managing wireless energy according to claim 6, further comprising a dynamic impedance matching circuit connected with said first rectifier, said first electrical switch, said second electrical switch and said wireless receiver, wherein said dynamic impedance matching circuit includes a variable capacitance circuit connected between said first rectifier and said wireless receiver and connected with said first electrical switch and said second electrical switch, and said dynamic impedance matching circuit has said operation voltage value and detects said first DC voltage, and said first rectifier receives said AC voltage through said variable capacitance circuit, and said first rectifier has an internal capacitor and a discharging switch connected in parallel and connected with said dynamic impedance matching circuit, and said discharging switch is turned off initially, and said first DC voltage applies a sensing voltage to said internal capacitor, and when said first DC voltage is larger than said operation voltage value, said dynamic impedance matching circuit turns on said discharging switch a plurality of times during a fixed period to thereby calculate respective time durations where said sensing voltage rises from a low voltage to a high voltage, and said dynamic impedance matching circuit chooses a shortest one of said time durations and responsively adjusts a capacitive impedance value of said variable capacitance circuit to match input impedance of said first rectifier.

9. The device for harvesting and managing wireless energy according to claim 8, wherein said dynamic impedance matching circuit further includes:
an operation voltage detector, having said operation voltage value, connected with said first rectifier, and detecting said first DC voltage, wherein when said first DC voltage is larger than said operation voltage value, said operation voltage detector generates an operation digital signal;
an AND gate, connected with said operation voltage detector, receiving said operation digital signal and a third clock signal and responsively generating an enable signal for said fixed period; and
a controller, connected with said AND gate, said discharging switch, said internal capacitor and said variable capacitance circuit, receiving said enable signal, said high voltage, said low voltage, said sensing voltage and a fourth clock signal, wherein said controller based on said enable signal and said fourth clock signal calculates said time durations where said sensing voltage rises from said low voltage to said high voltage, and when said sensing voltage is larger than said high voltage, said controller instantaneously turns on said discharging switch to discharge said internal capacitor, and said controller chooses said shortest one of said time durations and responsively adjusts said capacitive impedance value of said variable capacitance circuit.

10. The device for harvesting and managing wireless energy according to claim 2, further comprising:
a P-channel metal-oxide-semiconductor field effect transistor (PMOSFET) with a drain thereof connected with said second capacitor, wherein a body and a source of said PMOSFET are connected; and
an N-channel metal-oxide-semiconductor field effect transistor (NMOSFET) with a drain thereof connected with said first capacitor, wherein a body and a source of said NMOSFET are connected, and said sources of said PMOSFET and said NMOSFET are connected, and gates of said PMOSFET and said NMOSFET are respectively connected with said first capacitor and said second capacitor, and said PMOSFET and said NMOSFET prevent current flow from said first capacitor to said second capacitor, and when a voltage of said second capacitor is larger than said first DC voltage, said second capacitor provides electric energy for said first capacitor and said load through said PMOSFET and said NMOSFET.

* * * * *